United States Patent [19]

Niwa et al.

[11] Patent Number: 5,422,306

[45] Date of Patent: Jun. 6, 1995

[54] METHOD OF FORMING SEMICONDUCTOR HETERO INTERFACES

[75] Inventors: Masaaki Niwa, Hirakata; Masaharu Udagawa, Tokyo; Yoshihiko Hirai, Shiginonishi; Juurou Yasui, Toyonaka, all of Japan

[73] Assignee: Matsushita Electric Industrial Co., Ltd., Osaka, Japan

[21] Appl. No.: 990,702

[22] Filed: Dec. 15, 1992

[30] Foreign Application Priority Data

Dec. 17, 1991 [JP] Japan .................. 3-333309

[51] Int. Cl.⁶ ............................................. H01L 21/20
[52] U.S. Cl. .................................. 437/132; 437/238; 437/239; 437/919; 437/939; 148/DIG. 118; 148/DIG. 14; 117/95; 117/106; 117/935
[58] Field of Search ............ 437/132, 239, 238, 919, 437/939; 148/DIG. 118, DIG. 14; 117/95, 106, 935

[56] References Cited

U.S. PATENT DOCUMENTS

| | | | |
|---|---|---|---|
| 3,877,982 | 4/1975 | Coldren et al. | 437/233 |
| 3,892,891 | 7/1975 | Goodman et al. | 148/DIG. 118 |
| 5,032,545 | 7/1991 | Doan et al. | 437/242 |
| 5,042,887 | 8/1991 | Yamada | 359/360 |
| 5,124,272 | 6/1992 | Saito et al. | 437/45 |
| 5,199,994 | 4/1993 | Aoki | 156/345 |
| 5,298,452 | 3/1994 | Meyerson | 437/81 |

FOREIGN PATENT DOCUMENTS

| | | | |
|---|---|---|---|
| 226029 | 9/1988 | Japan | 437/239 |
| 11321 | 1/1989 | Japan | 156/610 |
| 280322 | 11/1989 | Japan | 437/939 |
| 239614 | 9/1990 | Japan | 156/610 |
| 11635 | 1/1991 | Japan | 437/919 |
| 178126 | 8/1991 | Japan . | |

OTHER PUBLICATIONS

M. Niwa et al., "SiO₂/Si Interfaces Studied by Scanning Tunneling Microscopy and High Resolution Transmission Electron Microscopy", *Journal of the Electrochemical Society*, vol. 139, No. 3, at pp. 901–906 (Mar. 1992).
R. Kliese, et al., "Real-time STM investigation of the initial stages of oxygen interaction with Si(100) 2×1", *Ultramicroscopy* 42–44, at 824–831 (1992).
G. S. Higashi, et al., "Ideal Hydrogen Termination of the Si(111) Surface", *Appl. Phys. Lett. 56(7)*, at 656–658 (Feb. 1990).
Satoru Watanabe, et al., "Homogeneous Hydrogen-Terminated Si(111) Surface Formed Using Aqueous HF Solution and Water", *Appl. Phys. Lett* 59(12), at 1458–1460 (Sep. 1991).
Ph. Avouris and D. Cahill, "STM Studies of Si(100) −2×1 Oxidation: Defect Chemistry and Si Ejection", *Ultramicroscopy* 42–44, at 838–844 (1992).
M. Udagawa, et al., "The Initial Stages of the Oxidation of Si(100) 2×1 Studied by STM", *Ultramicroscopy* 42–44, at 946–951 (1992).
S. Wolf *Silicon Processing for the VLSI Era vol. 2: Process Integration;* Lattice Press; Sunset Beach, Calif. (1990) pp. 331–333.

*Primary Examiner*—R. Bruce Breneman
*Assistant Examiner*—Linda J. Fleck
*Attorney, Agent, or Firm*—Ratner & Prestia

[57] ABSTRACT

A method is disclosed of forming semiconductor hetero interfaces that will contribute to the performance improvement of devices having semiconductor hetero interfaces such as MOS transistors, quantum devices, capacitors and the like. The method comprises the steps of making the surface of a semiconductor substrate clean and flat in terms of atomic level by heating said semiconductor substrate in vacuum to a temperature at which reconstruction of the surface atoms of said semiconductor substrate takes place, then forming a structural buffer layer such as a native oxide layer and the like on said semiconductor substrate surface after the temperature of said semiconductor substrate was lowered to room temperature and finally subjecting the semiconductor substrate with said structural buffer layer formed on its surface to a thermal treatment performed in certain specified temperature and atmosphere. Accordingly, the semiconductor substrate surface becomes smooth in terms of atomic level and an ultra smooth semiconductor interface is formed.

19 Claims, 6 Drawing Sheets

METHOD OF FORMING SEMICONDUCTOR HETERO INTERFACES

BACKGROUND OF THE INVENTION

The present invention relates to a method of forming semi-conductor hetero interfaces with extremely flat interfaces that are particularly desirable to produce micro MOS transistors, quantum devices and the like.

In recent years, methods to smooth hetero interfaces have been emphatically studied as one of the key technologies to produce next generation devices with submicron structures, such as quantum devices, MOS transistors, etc.

With the help of drawings, one of the conventional methods of forming semiconductor hetero interfaces will be explained, The steps in a conventional method of forming silicon oxide interfaces are illustrated in FIG. 8. Item 80 is a silicon substrate, and its cross-sectional view is shown in FIG. 8(a). The surface condition of the silicon substrate 80 is shown immediately after stripping off the wet oxide interface by hydrogen fluoride. The wet oxide interface had been formed by wet oxidation after cleaning the substrate by the RCA method (a cleaning method using a solution of hydrogen fluoride, ammonia, hydrogen peroxide, sulfuric acid, hydrochloric acid, etc). The substrate was cleaned in order to remove the layer formed by such processes as slicing, grinding and the like, with resultant lowering of the interface level further down into the silicon substrate 80.

Since formation of the wet oxide layer has a high oxidation progress speed, it is not suitable for forming an ultra thin oxide layer. Instead, dry oxidation wherein thermal oxidation takes place in dry ambient seems more advantageous for forming an ultra thin gate oxide layer. However, it has been pointed out that dry oxidation has a drawback of deteriorated dielectric breakdown voltage presumably due to the roughness of the oxidation interface. M. Niwa et al. J. Electrochem. Soc. 139(1992)901. Therefore, the case where the wet oxide layer was removed will be explained in FIG. 8.

The silicon substrate 80 with the wet oxide layer stripped off as explained in the foregoing is then thermally treated in dry oxygen ambient at 900° C. by means of an electric furnace. As a result, a dry oxide layer 81 of approximately 10 nm in thickness is formed as shown in FIG. 8(b).

To eliminate oxide layer defects such as pinholes, etc., the substrate is subsequently annealed in dry nitrogen gas for 20 minutes at 950° C. The mechanism involved with formation of the silicon oxide interface 82 is not yet known, but it is considered closely related to the size effect of the oxidizing species and the presence of silanol groups within the oxide layer. In other words, since $O_2$ molecules are larger than $H_2O$ molecules, and there cannot be any silanol groups serving as a structural buffer in dry oxidation, the oxidizing species do no enter into the silicon lattice positions uniformly, but infiltrate through the (111) facet having the longest net bond length, to react with silicon atoms. Therefore, in the case of dry oxidation, specific channels through which the oxidizing species infiltrate are formed, and oxidation is considered to develop through such channels. The Debye length for the case of dry oxide layer is about 15 nm.

In the present invention, a predominant portion of oxide layer formation takes place in the initial process region of oxidation where its mechanism is not yet known. Only towards the end of the layer formation process, namely, at the stage of forming the oxide layer in the vicinity of silicon oxide interface, does there seem to exist the possibility of oxidation taking place according to the reaction law of Deal-Grove. Therefore, the relatively large roughness height as observed in FIG. 8(b) is presumably attributed to the initial reaction between the silicon atoms and the oxidizing species that first entered the lattice through channels relatively easy to infiltrate like the (111) facet.

In addition, there are various kinds of surface irregularities appearing sectionally on the exterior of the roughness shown in FIG. 8(a). Each respective surface has its own speed of oxidation, resulting in the more complicated roughness contour of the oxide interface 82, as illustrated in FIG. 8(b).

After this gate oxide layer is formed, a gate electrode 83 consisting of polysilicon and serving as an electrode is deposited. FIG. 8(c) shows a cross-sectional view of the substrate after the gate electrode 83 was formed. An observation of the surface by transmission electron microscopy showed the rms (root mean square) figure of the interface roughness to be about 1.5 nm.

When a transistor operation is performed using this gate electrode 83, an inversion layer 84 is formed in the boundary region between the gate oxide layer 81 and the uppermost layer of the substrate 80, namely, in the oxide interface region, where a strong electric field is being applied.

Electrons 85 contributing to the transistor operation move at a high speed through the inversion layer 84. Due to the existence of the oxide interface roughness, the moving electrons 85 are scattered with a resultant reduction in the electron mobility. However, the foregoing constitution accompanied by dimensional restrictions due to the integration density increase as experienced in recent years has brought about a problem of deteriorated device characteristics caused by a mobility reduction due to scattering of electrons in transit at interfaces, a dielectric breakdown failure in ultra thin oxide layers and the like.

III. SUMMARY OF THE INVENTION

A flat semiconductor hetero interface is formed according to the steps of:

making the surface of a semiconductor substrate clean and flat in terms of atomic level by heating the semiconductor substrate in a vacuum to a temperature at which a rearrangement of the atoms on the semiconductor surface takes place;

forming a structural buffer layer like a native oxide layer, etc. on the semiconductor substrate surface after the temperature of the substrate is lowered to room temperature;

and forming a different kind of substance on the surface of said semiconductor substrate by subjecting the semiconductor substrate with said structural buffer layer formed on its surface to a thermal treatment performed in a certain specified temperature and atmosphere.

According to the foregoing method, a semiconductor surface which is flat in terms of atomic level and a different kind of substance like an oxide layer, etc. can be formed on the semiconductor surface. As a result, a reduction in interface scattering of the carriers running through the hetero interface can be realized.

Thus, the characteristics of quantum devices, MOS transistors and capacitors of large capacitance utilizing the hetero interface can be improved.

IV. BRIEF DESCRIPTION OF THE DRAWINGS

Figure 5A:
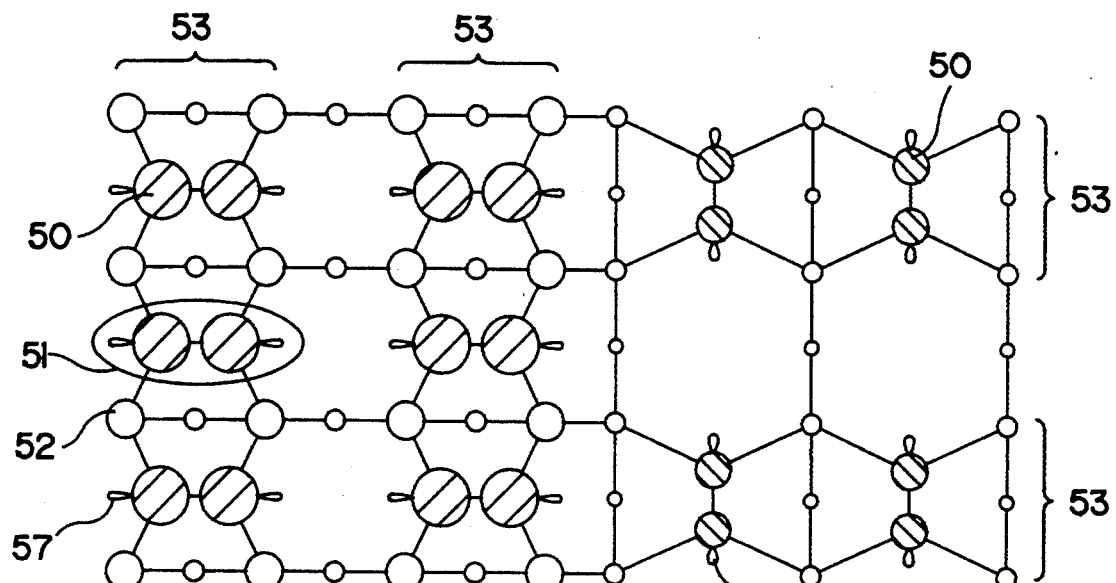
Figure 5B:
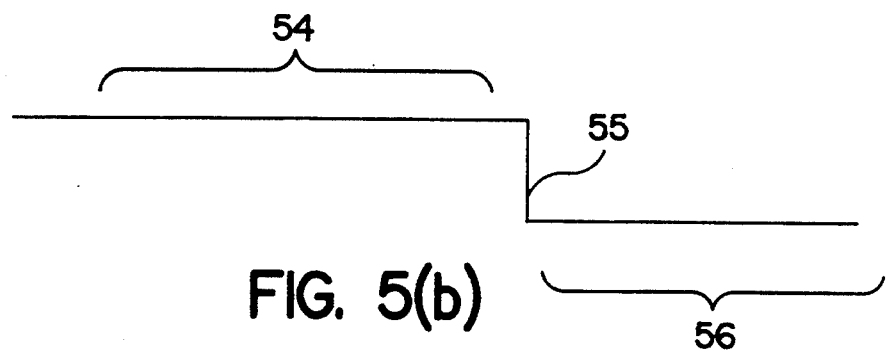
Figures 5C, 5D:
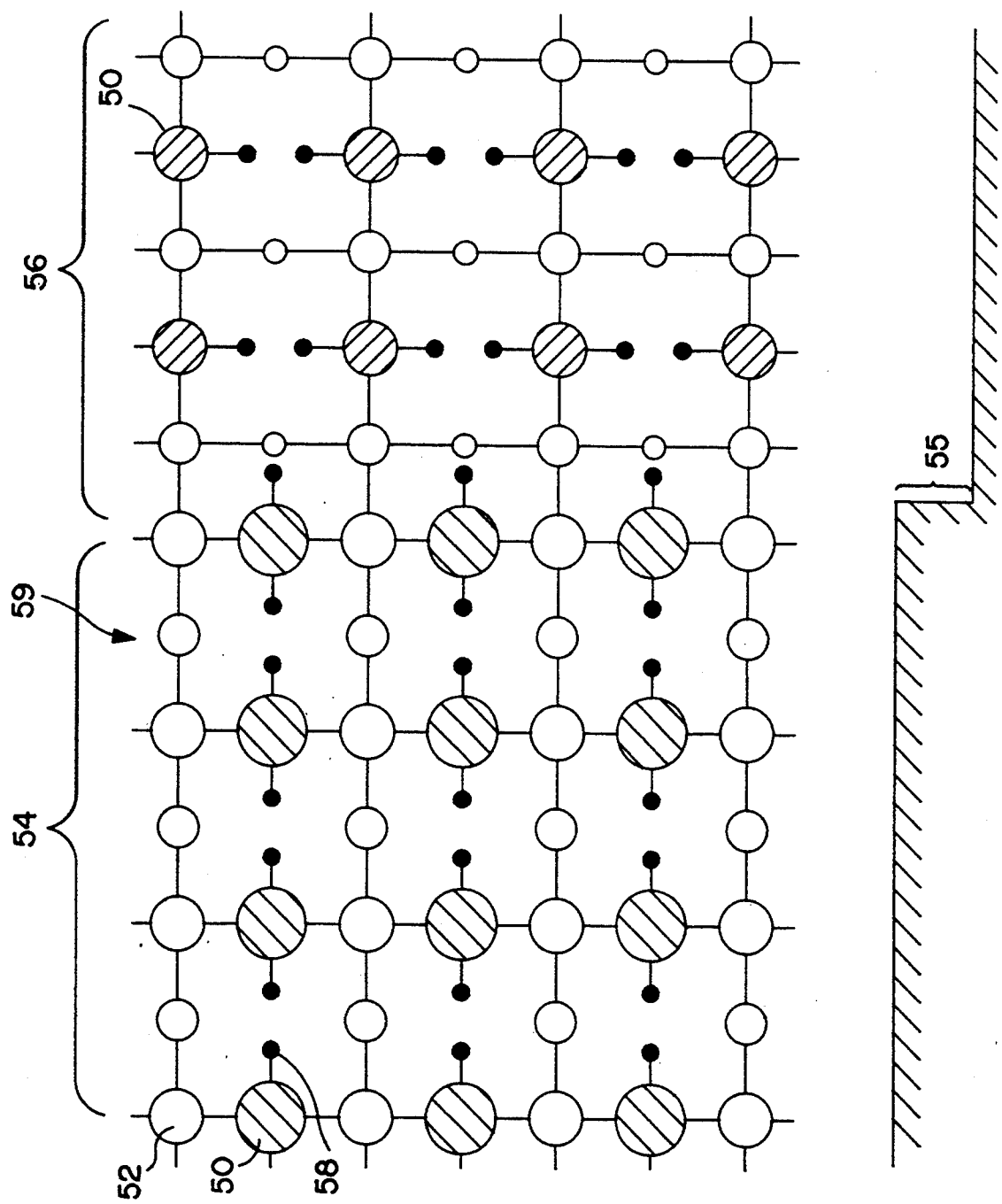

FIG. 5a shows a diagram which illustrates an arrangement of atoms on the surface of a silicon substrate for explaining the method of forming semiconductor hetero interfaces as employed in Example 2 of the embodiments of the present invention. FIG. 5b shows a cross-sectional view of the substrate in FIG. 5a. FIG. 5c shows the substrate with a mono-hydride layer formed thereon. FIG. 5d shows a cross-sectional view of the substrate in FIG. 5c.

Figure 6:
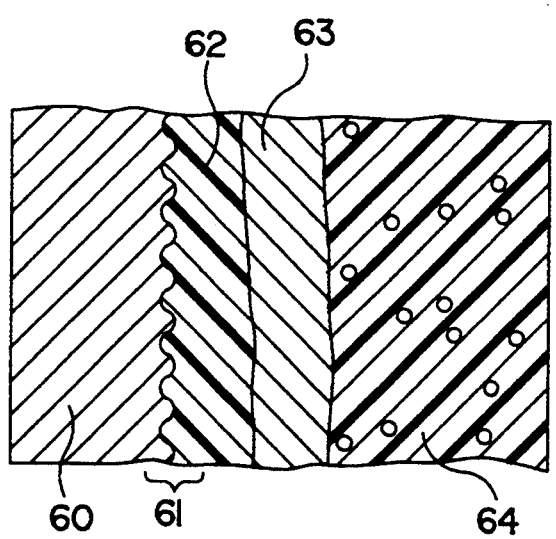

FIG. 6 is a detailed portion of a cross-sectional view of a capacitor made by the conventional method.

Figure 7:
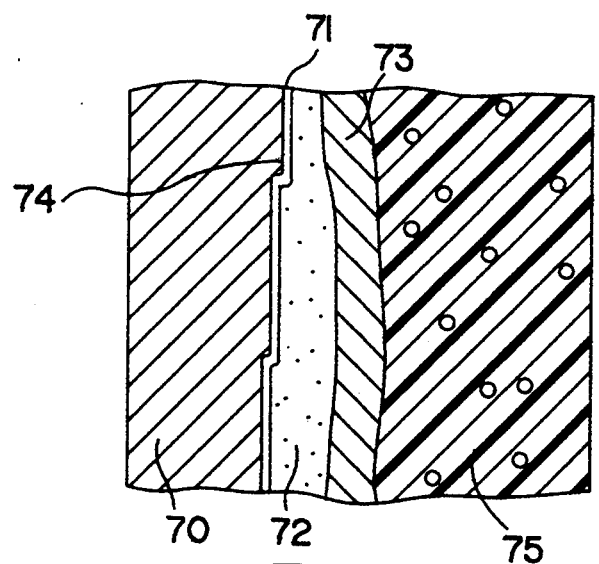

FIG. 7 is a detailed portion of a cross-sectional view of a capacitor made by the method of the present invention.

Figure 8A:
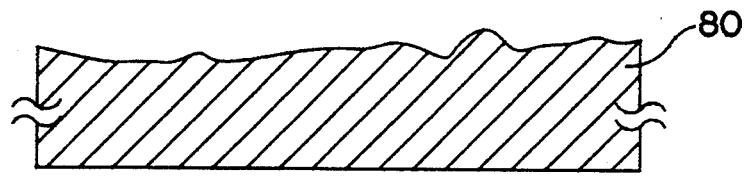
Figure 8B:
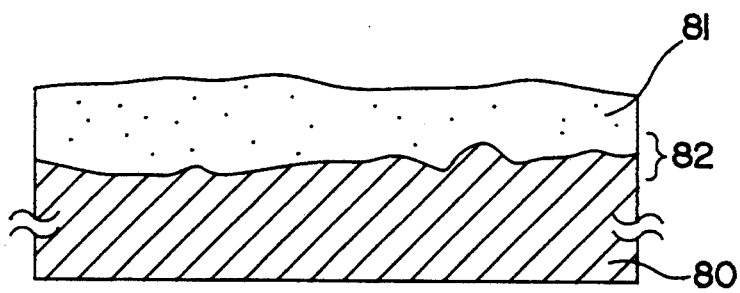
Figure 8C:
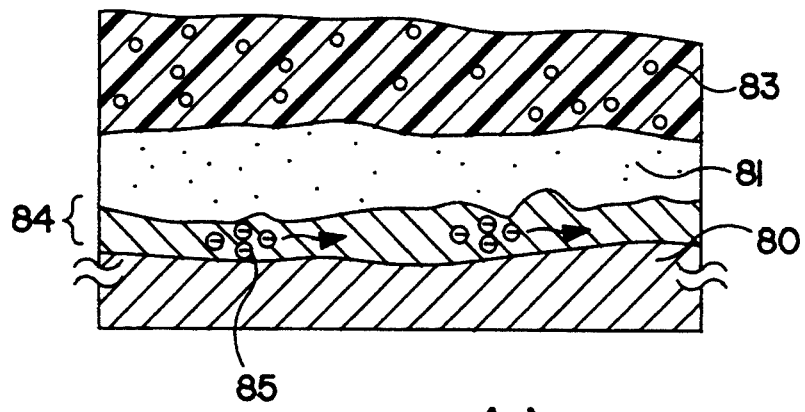

FIG. 8 is a series of cross-sectional views showing the steps of a conventional method of forming semi-conductor hetero interfaces.

V. DETAILED DESCRIPTION OF THE INVENTION

EXAMPLE 1

Example 1 of the embodiments of the present invention of a method of forming hetero interfaces is explained with the help of drawings as follows:

FIG. 1 is a series of cross-sectional views showing the steps of a first method of forming hetero interfaces as disclosed by the present invention. In FIG. 1, item 10 is a silicon substrate having the (111) face as its surface; item 11 depicts the surface roughness of the silicon substrate 10 after application of a process treatment according to the conventional method and just before formation of a gate oxide layer; item 12 shows the resulting clean surface after subjecting the substrate to a thermal treatment at a high temperature; item 13 is an atom step formed on the clean surface; items 14 are molecules, mainly composed of oxygen atoms, that were gathered by exposure in air; item 15 is a mon-atomic layer formed on the clean surface by absorbed oxygen molecules, item 16 is a native oxide layer composed of oxygen molecules that were gathered from air, and item 17 is a silicon oxide layer formed by thermal oxidation.

Figure 1A:
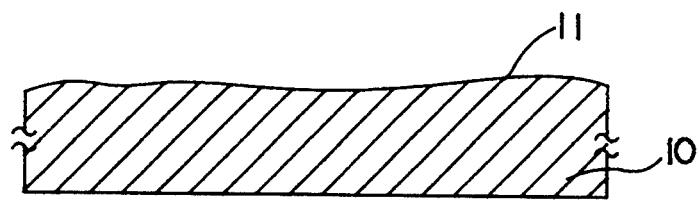
FIG. 1 is a series of cross-sectional views showing the steps of a method of forming semiconductor hetero interfaces as employed in Example 1 of the embodiments of the present invention.

With regard to the silicon oxide interface formed as in the foregoing, the steps and mechanism thereof will be explained with the help of FIGS. 1 and 2 in the following:

First, FIG. 1(a) shows the roughness 11 of a silicon substrate 10 after application of a process treatment according to the conventional method (stripping off an oxide layer by wet oxidation 2nd hydrogen fluoride treatment) and just before formation of a gate oxide layer. The silicon substrate 10 in this state was then placed in a ultra high vacuum chamber (achievable degree vacuum: $4-6\times10^{-9}$ Pa) and its surface was cleaned by instantaneous heating by means of an electric heating method to temperatures of 1100° to 1250° C. for 1 to 5 seconds.

Figure 1B:
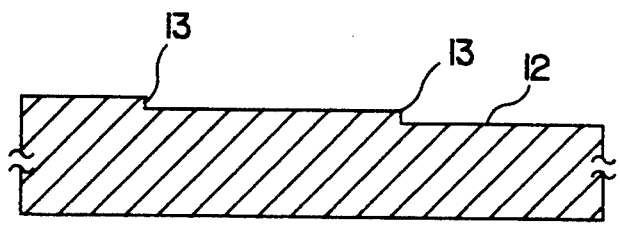

FIG. 1(b) illustrates the surface of the silicon substrate 10 after gradual cooling. The surface atoms have a $(2\times1)$ structure, and a step 13 corresponding to off-angle was recognized. In this step, not only were the substances absorbed on the silicon substrate surface removed but also the silicon atoms themselves were removed thermally. During the course of cooling, the fused silicon surface was smoothed by rearrangement of the surface atoms into a $(2\times1)$ structure, and a step 13 corresponding to an off-angle was formed.

Figure 1C:
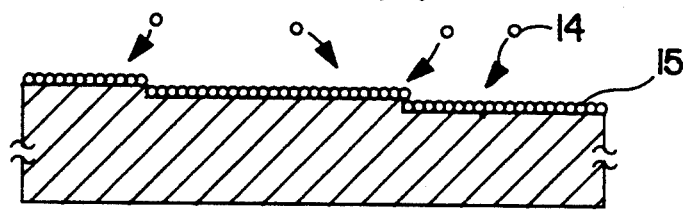
Figure 1D:
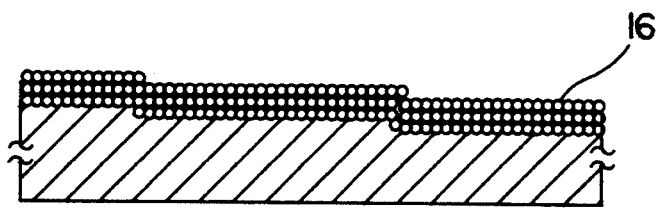
Figure 1E:
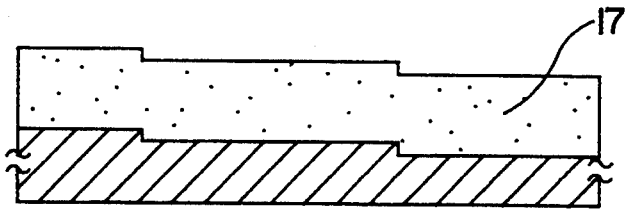

FIG. 1(c) shows a state wherein oxygen molecules 14 from air were absorbed on to the cleaned surface 12 to form a non-atomic layer when the silicon substrate 10 was taken out in to the air. The initial absorption process of the oxygen molecules 14 onto the cleaned surface 12 was confirmed through an observation by scanning tunneling microscopy. Oxygen molecules 14 from air were successively absorbed over the monatomic layer of the absorbed oxygen molecules 15 to form a native oxide layer 16. [FIG. 1(d)] The oxygen in air contributes, as a matter of course, to oxidation. In addition, the moisture contained in air not only serves as oxidizing species, but also as a buffer agent for the $SiO_2$ morphology which reduces the strain created in the oxide layer.

The foregoing clean surface 12 is terminated by the native oxide layer 16 and the structural buffer layer formed of other substances keeping the bonding state of its upper most silicon atoms intact. When oxygen atoms are directly absorbed in ultra high vacuum without this termination in air, sublimation of SiO and surface diffusion of Si sometimes takes place with a resultant disturbance of the clean surface.

Next, the substrate thus processed was subjected to an ordinary thermal oxidation in an electric furnace employing a dry oxidation method. The substrate was heated at around 900° C. in a dry oxygen atmosphere with a resultant formation of an oxide layer 17 measuring 5 nm in thickness. Subsequently, the substrate was annealed in dry nitrogen at 950° C. for 20 minutes to remove oxide layer defects like pin-holes, etc. [FIG. 1(e)] This reaction usually starts at the interface of Si-$O_2$/Si like an ordinary thermal oxidation and moves in the direction of the lower part of the silicon substrate 10. In general, as the thickness of an oxide layer increases, the layer formation mechanism changes from the mechanism observed in the initial step, to a reaction limited mechanism, and then to a diffusion limited mechanism. However, in this example, the thickness of the layer is so small that the initial step layer formation mechanism is retained, as in the prior art. The difference between the prior art and the present invention is that the surface condition of silicon substrate 10 of the present invention is flat in terms of atomic level. This presumably contributes to the suppression of opening of the specific infiltration channels for oxidizing species as is often experienced with the prior art, and promotes uniform reaction with the upper most silicon atoms. Observance of the cross-section of the silicon substrate by transmission electron microscopy after the substrate temperature was lowered to room temperature showed a two-stepped contour line and an interface roughness measuring about 0.4 nm in rms which is much smaller than that of the prior art.

The case wherein the foregoing embodiment example was applied to MOS transistors is explained below.

Figure 2:
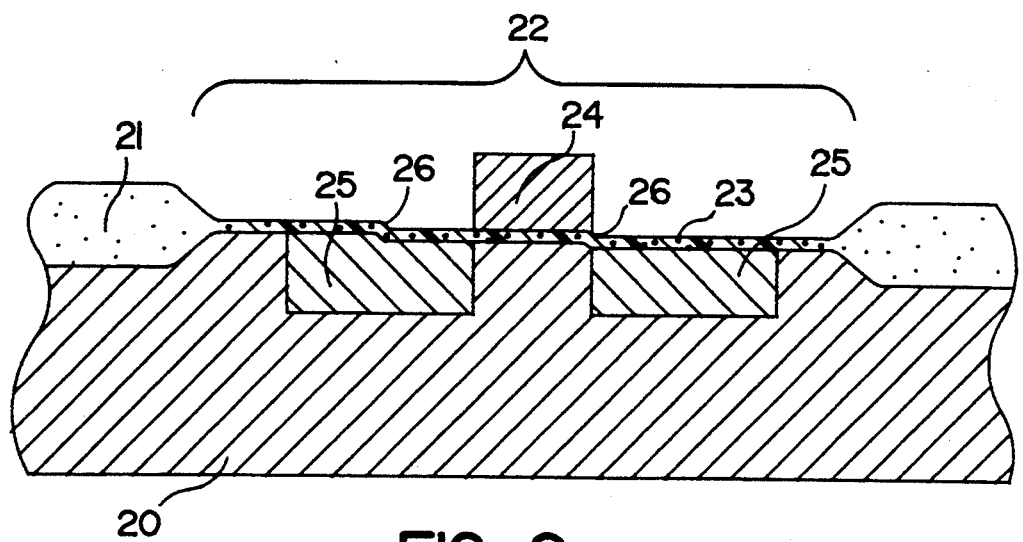
FIG. 2 is a detailed portion of a cross-sectional view of a MOS transistor made by the method of forming a semiconductor hetero interfaces as shown in FIG. 1.

In FIG. 2, after forming an active region 22 by means of device isolation through LOCOS oxide layer 21 formed on a silicon substrate 20, the surface of the active region 22 was cleaned by heating in ultra-high vacuum. Then, an ultra thin oxide layer of MOS transistor 23 and a gate electrode 24 were formed on the cleaned surface. In addition, a source-drain region 25 was formed by means of an ion implantation method. In this particular case, steps 26 were observed on the cleaned surface.

Figure 3:
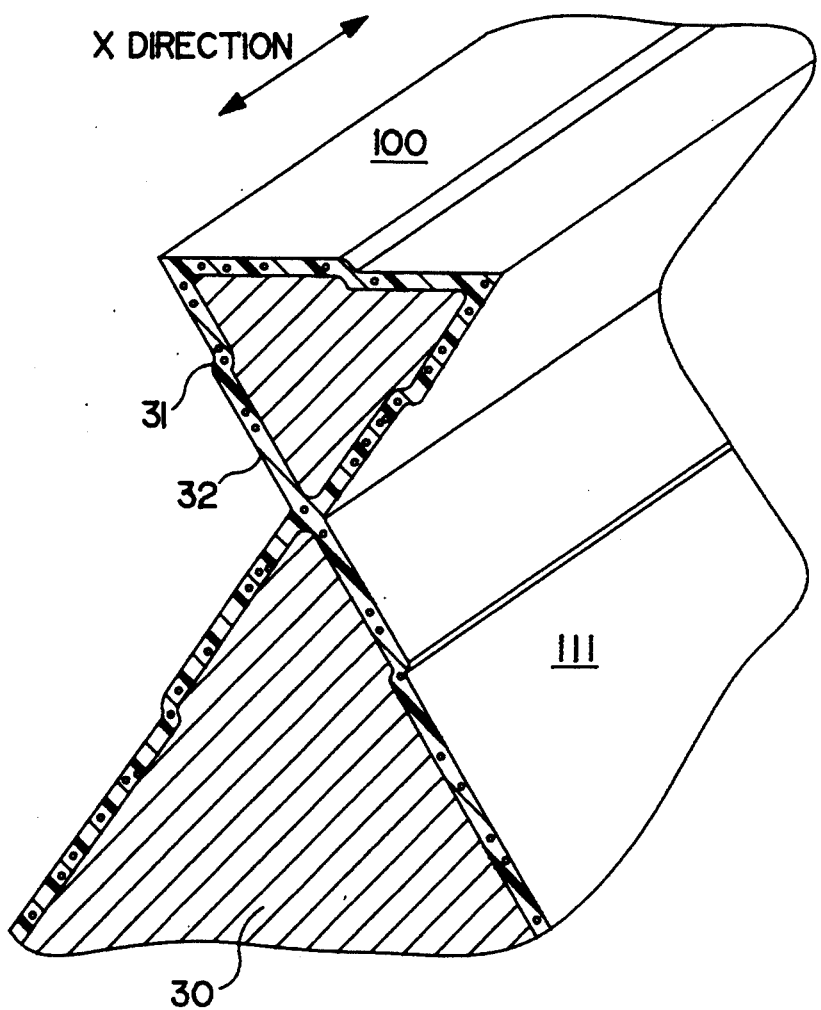
FIG. 3 is a detailed portion of a perspective view of a quantum device made by the method of forming semiconductor hetero interfaces as shown in FIG. 1.

FIG. 3 illustrates the case wherein the aforementioned exmplary embodiment was applied to quantum devices. The quantum wire section of a silicon quantum device was prepared through a fabricating process utilizing an isotropic etching applied to a silicon substrate 30 of (100) facet direction. The device was etched in such a way that its cross-sectional configuration was comprised of triangular patterns and looked like a numerical "eight", and each respective surface thereof was constructed by either a (100) or a (111) facet. In this state, the substrate was electrically heated along the X direction in ultra high vacuum to expose a clean surface on each respective facet. As a result, the aton steps 31 appeared on each respective facet. Then, the upper and lower silicon portions were separated by an oxide layer 32 after oxidation. This upper silicon portion has a micro-structured triangular configuration with each respective side measuring about 3 nm. The electrons running along the X direction through this triangular silicon quantum wire are confined structurally by the oxide layer 32, resulting in an electron scattering reduction to the lowest extent and realizing an ideal one-dimensional conduction.

Figure 4:
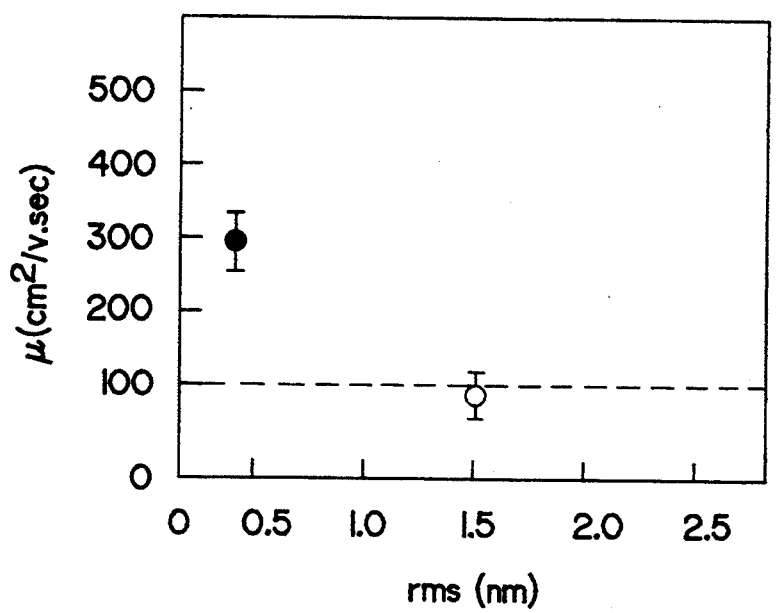
FIG. 4 is a diagram showing the relationship between electron mobility of a MOS transistor and roughness (rms) of an oxide interface, for a device made by the method disclosed by the present invention, in comparison with a device made by a conventional method.

FIG. 4 shows results of measurements to find electron mobility conducted on the MOS transistors prepared according to the prior art and by the foregoing embodiment example. The mobility in the MOS transistors of the prior art was 0.45 times the mobility $u_B = 400$ cm$^2$/v.sec of a silicon bulk while that of the aforementioned example was 0.75. The difference was due to the greater roughness of the silicon oxide interface in the prior art example. The effectiveness of the method employed in the foregoing example in increasing electron mobility was remarkable.

In the present example, the oxide interface was formed by exposing the clean surface to air. However, the same method can also be employed when a semiconductor-oxide interface or a metal interface is formed by an exposure to oxygen or a metal vapor atmosphere, respectively. The method disclosed by the present invention can also be employed when forming a superlattice structure of compound semiconductors having hetero interfaces.

According to the present example, a native oxide layer was formed in air after a clean silicon surface had been obtained in ultra high vacuum. Needless to say, the same result can be obtained by forming a structural buffer layer through an exposure of the clean surface to hydrogen molecules or water molecules in ultra high vacuum.

EXAMPLE 2

A second method of forming hetero interfaces as disclosed by the present invention is explained with he help of drawings as follows:

FIG. 5(a) is a view looking down onto the rearranged surface (2×1) of a silicon substrate that was formed according to Example 1 as presented in FIG. 1(b), for the purpose of explaining the second method of forming hetero interfaces. Two of the silicon atoms 50 (represented by shadowed circles) of the upper most surface combined to form a dimer 51. A plurality of these dimers formed a line over the lattice point silicon atoms 52 situated one layer below, with each respective line being separated by one line. The dimers were stabilized by completion of dimer rows.

FIG. 5(b) shows a cross-section of the substrate. The upper terrace 54 formed by rearrangement was partitioned off from the lower terrace 56 by a step 5 having a level difference of a monaromic layer. Item 7 is a dangling bond of the upper most silicon atom.

Then, the substrate temperature was lowered to room temperature, the substrate surface was uncovered, and a mono-hydride layer consisting of atomic hydrogen 58 was subsequently formed thereupon as illustrated in FIG. 5(c). This resulted in reconstruction of the rearranged (2×1) structure into the (1×1) structure. FIG. 5(d) shows the cross-section of the foregoing. Since atomic hydrogen 58 is monovalent, it terminates the layer by reaction with the dangling bonds 57 of the upper most silicon atoms 50 laying on the lattice points.

In the next step, the silicon substrate was exposed to an atmosphere having an oxygen partial pressure of $1.33 \times 10^{-6}$ Pa with the temperature kept below 500° C. Thus, the hydrogen 58 bonded with the upper most silicon atoms 50 was thermally detached, and oxygen molecules 59 from the air were physically absorbed to the silicon substrate as shown in FIG. 5(c). As shown in FIG. 5(a), in the case where no mono-hydride layer due to hydrogen termination is formed, a rearranged (2×1) structure will show up on the upper most surface. When this substrate surface is viewed from the exact upper side, silicon-silicon spacings will be recognized to exist between dimer rows 53 with the distances between such spacings reflecting an arrangement of irregularity thereof in a pattern where islands like irregularities are alternately distributed. In contrast, as shown in FIG. 5(c), when a mono-hydride layer due to hydrogen termination is formed, the surface will rearrange to a (1×1) structure, and the silicon-silicon openings will be uniformly distributed over the substrate surface. When different atoms or molecules are gathered from air, a more uniform absorption will take place with the latter case in comparison with the former.

The condition of the cleaned surface and the initial absorption process of oxygen molecules 59 were confirmed by scanning tunneling microscopy. In general, as the thickness of an oxide layer increases, the mechanism of layer formation changes from the initial step mechanism, to a reaction limited mechanism, to a diffusion limited mechanism. However, in case of this example, the thickness of the layer is so small that the initial step layer formation mechanism is retained as in the prior art. The difference between the prior art and the present invention is in the condition of the silicon surface which is flat in terms of atomic level. This is presumably contributes to a suppression of opening of the specific infiltration channels for oxidizing species as is often experienced with the prior art, and promotes uniform reaction with the upper most silicon atoms. Observance of the cross-section of the silicon substrate by transmission electron microscopy after the substrate temperature was lowered to room temperature showed a one step contour line and an interface roughness measuring about 0.4 nm in rms which is much smaller than that of the prior art.

In addition, the inactivating treatment of the substrate surface by means of hydrogen termination as employed in the present example is highly effective in preventing reoxidation in air.

The foregoing second method of forming hetero interfaces can be applied, as a matter of course, to fabrication of the MOS transistors and quantum devices as presented in FIG. 2 and FIG. 3, respectively, of the present example.

EXAMPLE 3

A method of fabricating capacitors that utilizes the method of forming semiconductor hetero interfaces as described in Example 2 will be dealt with in comparison with the prior art in the following:

FIG. 6 is a cross-sectional view of a conventional VLSI memory cell. Item 60 is a silicon substrate prepared by wet oxidation of a silicon substrate, after application of the RCA cleaning to the silicon substrate. The substrate was covered with a layer due to various kinds of processing that were applied to the silicon substrate surface for the purpose of lowering the oxide interface level down deeply into the silicon substrate. The foregoing wet oxide interface was stripped from the silicon substrate by a hydrogen fluoride treatment for the purpose of getting rid of the aforementioned layer formed by various kinds of processing such as slicing, polishing and the like. Item 61 shows the roughness existing on the silicon substrate 60. A silicon nitride layer ($Si_3N_4$) 62 measuring 6-7 nm in thickness was formed over the silicon substrate 60, and then an oxide layer ($SiO_2$) was formed thereupon. These two dielectric layers serve as the capacitive layers. Finally, a poly-crystalline silicon layer 64 was formed to serve as the electrode. In this way, a plate type capacitor cell serving as an experimental memory cell was prepared and its capacitance was measured. The thickness of the dielectric layer comprised of the silicon nitride layer 62 and the oxide layer 63 in the experimental memory cell was 6 nm converted to that of the oxide layer, and the dielectric breakdown voltage was 10 MV/cm at leak current of 1 uA/$cm^2$. The occupying area of the electrode was 0.040 $cm^2$ but its effective area was increased to 0.053 $cm^2$ through a roughening treatment applied to the electrode surface for increasing capacitance per unit occupying area. The capacitance of this capacitor cell was $3 \times 10^{-8}$ F/cm. One of the biggest problems of the prior art has been in increasing capacitance per memory cell. It is well known that a sufficient electrode occupying area for the required capacitance per memory cell cannot be obtained because the elements per chip increase. To solve this problem, extensive R & D activity has been conducted towards: 1) increasing effective electrode surface areas by such measures as employing a trench structure, roughening the electrode surface, etc., 2) employing dielectric materials of high dielectric constant, 3) making capacitive layers thinner, and the like.

However, the aforementioned conventional VLSI memory cell constitution cannot keep pace with the progress of the expected scaling down in future LSIs. In connection with the aforementioned R & D activity: 1) there is a dimensional limitation in processing for increasing electrode surface areas; 2) there are problems of matching between high dielectric constant materials like $Ta_2O_5$, etc. and silicon LSI processes and the like; and 3) there exists a limit in making capacitive layers thinner according to the existing constitution.

FIG. 7 shows a cross-sectional view of a capacitor cell fabricated by the method of forming hetero interfaces as demonstrated in Example 2 of the present invention's embodiments. A monaromic oxide layer 72 formed by absorption of oxygen molecules on to the clean surface 71 of the silicon substrate 70. This surface, obtained as in Example 2, which was hydrogen terminated, was further deposited with a silicon oxide layer 73. Item 74 shows an atomic step formed on the clean surface 71. After the aforementioned monatomic oxide layer 72 was formed through absorption of oxygen molecules, the silicon oxide layer 73 was deposited to a thickness of 2.3 nm by means of CVD method at a relatively low temperature so that the interface roughness structure would not be destroyed, and a capacitance oxide layer was completed. In the last step, a poly-crystalline silicon electrode 75 was deposited. Since the interface roughness structure of the present example presented a condition wherein an ultra flatness defined in terms of atomic level was maintained, roughening of a boundary interface often observed during the initial period of oxidation did not occur when a thin oxide layer was formed. When the cross-section was observed by transmission electron microscopy, no other kinds of interface roughness other than a step like contour 74 presumably due to off-angle of the silicon substrate 70 were seen. The interface thus obtained showed a great reduction in roughness compared with the prior art case.

In the present example of the embodiments of this invention, the dielectric breakdown voltage of a plane type capacitor cell structure was 9.6 MV/cm, where the combined thickness of the oxide layers 72 and 73 was 2.3 nm and the leakage current was 1 uA/$cm^2$. The occupying area of the electrode was 0.040 $cm^2$. The effective area of the electrode was also 0.040 $cm^2$ since no roughening treatment was applied to the electrode surface for increasing capacitance. This capacitor cell showed capacitance of $6 \times 10^{-8}$ F/cm, which was twice the capacitance of an oxide layer-nitride layer-oxide layer system capacitor cell (equivalent to an oxide layer of 6 nm thick) prepared by the method of the prior art, with almost the same dielectric breakdown voltage characteristics as the conventional capacitor cell, Although an oxide interface was formed by exposing the clean surface to oxygen atmosphere in the present example. Needless to say the same effect would be expected from a semiconductor-metal interface structure which was formed by exposing the clean surface directly to a metal vapor atmosphere.

Of course, the aforementioned method of fabricating capacitors can be realized by use of the method of forming semiconductor hetero interfaces as described in Example 1.

As explained in the foregoing, the present invention relates to a method comprising the steps of making the surface of a semiconductor substrate clean and flat in terms of atomic level by heating the semiconductor substrate to a temperature at which rearrangement of the surface atoms of the semiconductor substrate takes place, stabilizing the bonding state of the clean surface through terminating the semiconductor substrate surface by a native oxide layer or other monaromic layer after the semiconductor substrate temperature was lowered to room temperature, and forming a different kind of substance on the aforementioned semiconductor substrate surface by subjecting the semiconductor substrate having the stabilized surface to a thermal treatment performed in a certain specified temperature and atmosphere. As a result, such effects as a reduction in scattering of transit carriers at the interface, a higher speed in MOS devices, quantum devices, etc. and larger capacitance in capacitors have been realized.

What is claimed is:

1. A method of forming semiconductor hetero interfaces comprising the steps of:
    heating a semiconductor substrate in a vacuum to a temperature at which reconstruction of the surface atoms of said semiconductor substrate takes place;
    lowering the temperature of said semiconductor substrate;
    forming a structural buffer layer on the surface of said semiconductor substrate after the temperature of said semiconductor substrate was lowered to room temperature;
    and
    forming a further layer on the surface of said semiconductor substrate by subjecting the semiconductor substrate with said structural buffer layer formed on its surface to a thermal treatment performed at a specified temperature and atmosphere.

2. A method of fabricating ultra thin capacitors comprising the steps of:
    heating a semiconductor substrate in a vacuum to a temperature at which reconstruction of the surface atoms of said semiconductor substrate takes place;
    lowering the temperature of said semiconductor substrate;
    forming a structural buffer layer on the surface of said semiconductor substrate after the temperature of said semiconductor substrate was lowered to room temperature;
    and
    forming a further layer on the surface of said semiconductor substrate by subjecting the semiconductor substrate with said structural buffer layer formed on its surface to a thermal treatment performed at a specified temperature and atmosphere.

3. A method of fabricating quantum devices comprising the steps of:
    heating a semiconductor substrate in a vacuum to a temperature at which reconstruction of the surface atoms of said semiconductor substrate takes place;
    lowering the temperature of said semiconductor substrate;
    forming a structural buffer layer on the surface of said semiconductor substrate surface after the temperature of said semiconductor substrate was lowered to room temperature;
    and
    forming a further layer on said semiconductor substrate surface by subjecting the semiconductor substrate with said structural buffer layer formed on its surface to a thermal treatment performed at a specified temperature and atmosphere.

4. A method of fabricating MOS transistors comprising the steps of:
    heating a semiconductor substrate in a vacuum to a temperature at which reconstruction of the surface atoms of said semiconductor substrate takes place;
    lowering the temperature of said semiconductor substrate;.
    forming a structural buffer layer on the surface of said semiconductor substrate after the temperature of said semiconductor substrate was lowered to room temperature;
    and
    forming a further layer on the surface of said semiconductor substrate surface by subjecting the semiconductor substrate with said structural buffer layer formed on its surface to a thermal treatment performed at a specified temperature and atmosphere.

5. A method of forming semiconductor hetero interfaces comprising the steps of:
    heating a semiconductor substrate in a vacuum to a temperature at which reconstruction of the surface atoms of said semiconductor substrate takes place:
    lowering the temperature of said semiconductor substrate;
    inactivating the surface of said semiconductor substrate by terminating dangling bonds on the surface of said semiconductor substrate by monovalent atoms after the temperature of said semiconductor substrate was lowered to room temperature;
    and
    forming a further layer on the surface of said semiconductor substrate by subjecting the semiconductor substrate with its surface inactivated to a thermal treatment performed at a specified temperature and atmosphere.

6. A method of fabricating ultra thin capacitors comprising the steps of:
    heating a semiconductor substrate in a vacuum to a temperature at which reconstruction of the surface atoms of said semiconductor substrate takes place;
    lowering the temperature of said semiconductor substrate;
    inactivating the surface of said semiconductor substrate by terminating dangling bonds on the surface of said semiconductor substrate by monovalent atoms after the temperature of said semiconductor substrate was lowered to room temperature;
    and
    forming a further layer on the surface of said semiconductor substrate by subjecting the semiconductor substrate with its surface inactivated to a thermal treatment performed at a specified temperature and atmosphere.

7. A method of fabricating quantum devices comprising the steps of:
    heating a semiconductor substrate in a vacuum to a temperature at which reconstruction of the surface atoms of said semiconductor substrate takes place;
    lowering the temperature of said semiconductor substrate;
    inactivating the surface of said semiconductor substrate by terminating dangling bonds on the surface of said semiconductor substrate by monovalent atoms after the temperature of said semiconductor substrate was lowered to room temperature;
    and forming a different kind of substance on the surface of said semiconductor substrate by subjecting the semiconductor substrate with its surface inactivated to a thermal treatment performed at a specified temperature and atmosphere.

8. A method of fabricating MOS transistors comprising the steps of:

heating a semiconductor substrate in a vacuum to a temperature at which reconstruction of the surface atoms of said semiconductor substrate takes place;

lowering the temperature of said semiconductor substrate;

inactivating the surface of said semiconductor substrate by terminating dangling bonds on the surface of said semiconductor substrate by monovalent atoms after the temperature of said semiconductor substrate was lowered to room temperature; and forming a further layer on said semiconductor substrate surface by subjecting the semiconductor substrate with its surface inactivated to a thermal treatment performed at a specified temperature and atmosphere.

9. The method according to claim 1, wherein said vacuum exceeds $4 \times 10^{-9}$ Pa.

10. The method according to claim 4, wherein said vacuum exceeds $4 \times 10^{-9}$ Pa.

11. The method of claim 1, wherein said semiconductor substrate has an oxide layer and wherein said semiconductor substrate is heated during the heating step to remove said oxide layer.

12. The method of claim 2, wherein said semiconductor substrate has an oxide layer and wherein said semiconductor substrate is heated during the heating step to remove said oxide layer.

13. The method of claim 3, wherein said semiconductor substrate has an oxide layer and wherein said semiconductor substrate is heated during the heating step to remove said oxide layer.

14. The method of claim 4, wherein said semiconductor substrate has an oxide layer and wherein said semiconductor substrate is heated during the heating step to remove said oxide layer.

15. The method of claim 5, wherein said semiconductor substrate has an oxide layer and wherein said semiconductor substrate is heated during the heating step to remove said oxide layer.

16. The method of claim 6, wherein said semiconductor substrate has an oxide layer and wherein said semiconductor substrate is heated during the heating step to remove said oxide layer.

17. The method of claim 7, wherein said semiconductor substrate has an oxide layer and wherein said semiconductor substrate is heated during the heating step to remove said oxide layer.

18. The method of claim 8, wherein said semiconductor substrate has an oxide layer and wherein said semiconductor substrate is heated during the heating step to remove said oxide layer.

19. A method of forming silicon hetero interfaces comprising the steps of:

heating a silicon substrate in a vacuum to a temperature at which reconstruction of the surface atoms of said silicon substrate takes place;

lowering the temperature of said silicon substrate;

forming a structural buffer layer on the surface of said silicon substrate after the temperature of said silicon substrate was lowered to room temperature; and forming a further layer on the surface of said silicon substrate by subjecting the silicon substrate with said structural buffer layer formed on its surface to a thermal treatment performed at a specified temperature and atmosphere.

* * * * *